(12) United States Patent
Lv

(10) Patent No.: US 10,325,939 B2
(45) Date of Patent: Jun. 18, 2019

(54) THIN-FILM TRANSISTOR ARRAY SUBSTRATE AND MANUFACTURING METHOD THEREOF

(71) Applicant: Shenzhen China Star Optoelectronics Technology Co. Ltd., Shenzhen (CN)

(72) Inventor: Xiaowen Lv, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 9 days.

(21) Appl. No.: 15/701,454

(22) Filed: Sep. 12, 2017

(65) Prior Publication Data

US 2017/0373097 A1    Dec. 28, 2017

Related U.S. Application Data

(62) Division of application No. 14/763,818, filed on Jul. 27, 2015, now Pat. No. 9,806,106.

(30) Foreign Application Priority Data

Apr. 27, 2015 (CN) .......................... 2015 1 0206317

(51) Int. Cl.
| | |
|---|---|
| H01L 27/12 | (2006.01) |
| H01L 51/52 | (2006.01) |
| H01L 51/56 | (2006.01) |
| H01L 29/49 | (2006.01) |
| H01L 29/51 | (2006.01) |

(Continued)

(52) U.S. Cl.
CPC ...... *H01L 27/1255* (2013.01); *H01L 27/1225* (2013.01); *H01L 27/1259* (2013.01); *H01L 29/4908* (2013.01); *H01L 29/517* (2013.01); *H01L 29/66969* (2013.01); *H01L 29/7869* (2013.01); *H01L 51/52* (2013.01); *H01L 51/56* (2013.01)

(58) Field of Classification Search
CPC ............. H01L 27/1255; H01L 27/1225; H01L 27/1259; H01L 29/4908; H01L 29/517
USPC .......................................................... 257/43
See application file for complete search history.

(56) References Cited

U.S. PATENT DOCUMENTS

| | | | | | |
|---|---|---|---|---|---|
| 4,885,616 | A | * | 12/1989 | Ohta ..................... | H01L 29/458 257/59 |
| 5,053,347 | A | * | 10/1991 | Wu ...................... | H01L 29/6675 257/57 |

(Continued)

*Primary Examiner* — Ori Nadav
(74) *Attorney, Agent, or Firm* — Leong C. Lei

(57) ABSTRACT

A method is provided for manufacturing a thin film transistor array substrate, which includes: a substrate on which a thin film transistor and a storage capacitor are formed on the substrate. The storage capacitor includes a first electrode plate formed on the substrate, a gate isolation layer or an etching stopper layer formed on the first electrode plate, and a second electrode plate formed on the gate isolation layer or the etching stopper layer. The etching stopper layer may be formed on the gate isolation layer, of which one is partially etched and removed such that there is only one of the gate isolation layer and the etching stopper layer existing between the two electrode plates of the storage capacitor so as to reduce the overall thickness of the isolation layer of the storage capacitor. Thus, the capacitor occupies a smaller area and a higher aperture ratio may be achieved.

5 Claims, 3 Drawing Sheets

(51) Int. Cl.
*H01L 29/66* (2006.01)
*H01L 29/786* (2006.01)

(56) References Cited

U.S. PATENT DOCUMENTS

| | | | | |
|---|---|---|---|---|
| 5,075,244 A | * | 12/1991 | Sakai | H01L 21/84 257/59 |
| 6,593,592 B1 | * | 7/2003 | Yamazaki | H01L 27/1237 257/59 |
| 7,206,033 B2 | * | 4/2007 | Yoo | G02F 1/136213 349/138 |
| 2003/0001493 A1 | * | 1/2003 | Park | G09G 3/3225 313/504 |
| 2005/0285197 A1 | * | 12/2005 | Park | H01L 29/4908 257/347 |
| 2006/0289867 A1 | * | 12/2006 | Lim | H01L 29/42384 257/59 |

\* cited by examiner

THIN-FILM TRANSISTOR ARRAY SUBSTRATE AND MANUFACTURING METHOD THEREOF

CROSS REFERENCE TO RELATED APPLICATIONS

This is a divisional application of co-pending patent application Ser. No. 14/763,818 filed on Jul. 27, 2015, which is a national stage of PCT Application Number PCT/CN2015/079421, filed on May 21, 2015, claiming foreign priority of Chinese Patent Application Number 201510206317.5, filed on Apr. 27, 2015.

FIELD OF THE INVENTION

The present invention relates to a flat panel display field, and more particularly to a thin film transistor array substrate and a manufacture method thereof.

BACKGROUND OF THE INVENTION

The active matrix panel display elements possess many merits of thin frame, power saving, no radiation, etc. and have been widely used. In the present market, the flat panel display comprises Liquid Crystal Displays (LCD) and Organic Light Emitting Diodes (OLED).

The LCD comprises a liquid crystal display panel and a backlight module. The working principle of the liquid crystal display panel is to locate liquid crystal molecules between two parallel glass substrates. The light of back light module is reflected to generate images by applying driving voltages to control whether the liquid crystal molecules to be changed directions.

An OLED possesses properties of self-illumination, high brightness, wide view angle, high contrast, flexibility and low power consumption, etc., and accordingly has been received more attentions. As being the display of next generation, it has been gradually replaced traditional liquid crystal displays and widely applied in cellular phone screens, computer displays, full color TV, etc. OLED display technology is different from the traditional liquid crystal display technology and the back light is not required. It utilizes an ultra thin organic material coating layer and a glass substrate, and theses organic material will illuminate when the current is conducted.

The thin film transistor array substrate has been widely applied in LCD and OLED, which generally comprises a glass substrate and a thin film transistor and a storage capacitor formed on the glass substrate.

The storage capacitor plays a role having the important functions of maintaining voltage level, reducing the coupling capacitor dividing voltage. Generally, we prefer a larger capacitance. The calculation of the capacitance is $C=\varepsilon S/D$, wherein S represents the area, and D represents the isolation layer thickness. To change the value of the storage capacitor, several methods are listed, of which the first one is selecting an isolation material with a larger dielectric constant the second one is increasing the area; and the third one is reducing the isolation layer thickness.

Generally, enlarging the relative area of the two metal plates will increase the capacitance. However, the storage capacitor is commonly manufactured by clamping the isolation layer. The metal electrode is opaque. The larger the storage capacitor is, the lower the aperture ratio becomes. Reducing the isolation layer thickness can increase the value of the storage capacitor, and on this basis, the relative area of the metal plates can be properly reduced, which is a better method of increasing the storage capacitor and raising the aperture ratio.

Referring to FIG. 1, a sectional view is provided to illustrate a known thin film transistor array substrate, which comprises a substrate 100, and a thin film transistor and a storage capacitor formed on the substrate 100. The first electrode plate 310 and the second electrode plate 320 of the storage capacitor clamp the gate isolation layer 300 and the etching stopper layer 500 in-between. Because both the gate isolation layer 300 and the etching stopper layer 500 possess a certain thickness, which makes that the isolation layer is thicker and the storage capacitance is smaller. A larger relative area is required for obtaining a desired capacitance value. Therefore, the element aperture ratio is reduced.

SUMMARY OF THE INVENTION

An objective of the present invention is to provide a thin film transistor array substrate, possessing higher an aperture ratio while as having a larger storage capacitor.

Another objective of the present invention is to provide a manufacturing method of a thin film transistor array substrate for increasing the aperture ratio while enlarging the storage capacitor.

For realizing the aforesaid objectives, the present invention provides a thin film transistor array substrate, comprising a substrate and a thin film transistor and a storage capacitor formed on the substrate;

wherein the storage capacitor comprises a first electrode plate on the substrate, a gate isolation layer or an etching stopper layer on the first electrode plate, a second electrode plate on the gate isolation layer or the etching stopper layer.

The thin film transistor array substrate comprises a substrate, a first gate, a second gate and a first electrode plate at one side of the second gate away from the first gate positioned on the substrate, a gate isolation layer positioned on the first gate, the second gate, the first electrode plate and the substrate, a first oxide semiconductor layer and a second oxide semiconductor layer respectively above the first gate and the second gate positioned on the gate isolation layer, a second electrode plate above the first electrode plate positioned on the gate isolation layer, an etching stopper layer positioned on the first oxide semiconductor layer, the second oxide semiconductor layer and the gate isolation layer, a first source, a first drain, a second source, a second drain respectively above the first gate and the second gate positioned on the etching stopper layer, a passivation layer positioned above the first source, the first drain, the second source, the second drain and the second electrode plate covering the etching stopper layer, a flat layer positioned on the passivation layer, a pixel electrode layer positioned on the flat layer, a pixel definition layer positioned on the flat layer and the pixel electrode layer and a photospacer positioned on the pixel definition layer;

wherein the gate isolation layer is provided with a first via hole correspondingly above the second gate close to one side of the first gate, and the passivation layer and the flat layer are provided with a second via hole correspondingly above the second source, and the pixel definition layer is provided with a third via hole correspondingly above the pixel electrode layer; the first source, the first drain contact with the first oxide semiconductor layer, and the second source and the second drain contact with the second oxide semiconductor layer, and the first source contacts with the second gate through the first via hole, and the pixel electrode layer contacts with the second source through the second via hole, and the third via hole exposes a portion of the pixel electrode layer; and the first gate, the second gate, the gate isolation layer, the first oxide semiconductor layer, the second oxide semiconductor layer, the etching stopper layer, the first source, the first drain, the second source and the second drain construct a thin film transistor; the first electrode plate, the second electrode plate and the gate isolation layer between the first electrode plate and the second electrode plate construct a storage capacitor.

The thin film transistor array substrate comprises a substrate, a first gate, a second gate and a first electrode plate at one side of the second gate away from the first gate positioned on the substrate, a gate isolation layer positioned on the first gate, the second gate and the substrate, a first oxide semiconductor layer and a second oxide semiconductor layer respectively above the first gate and the second gate positioned on the gate isolation layer, an etching stopper layer positioned on the first oxide semiconductor layer, the second oxide semiconductor layer, the gate isolation layer and the first electrode plate, a second electrode plate above the first electrode plate positioned on the etching stopper layer, a first source, a first drain, a second source, a second drain respectively above the first gate and the second gate positioned on the etching stopper layer, a passivation layer positioned above the first source, the first drain, the second source, the second drain and the second electrode plate covering the etching stopper layer, a flat layer positioned on the passivation layer, a pixel electrode layer positioned on the flat layer, a pixel definition layer positioned on the flat layer and the pixel electrode layer and a photospacer positioned on the pixel definition layer;

wherein the gate isolation layer is provided with a first via hole correspondingly above the second gate close to one side of the first gate, and the passivation layer and the flat layer are provided with a second via hole correspondingly above the second source, and the pixel definition layer is provided with a third via hole correspondingly above the pixel electrode layer; the first source, the first drain contact with the first oxide semiconductor layer, and the second source and the second drain contact with the second oxide semiconductor layer, and the first source contacts with the second gate through the first via hole, and the pixel electrode layer contacts with the second source through the second via hole, and the third via hole exposes a portion of the pixel electrode layer; and the first gate, the second gate, the gate isolation layer, the first oxide semiconductor layer, the second oxide semiconductor layer, the etching stopper layer, the first source, the first drain, the second source and the second drain construct a thin film transistor; the first electrode plate, the second electrode plate and the etching stopper layer between the first electrode plate and the second electrode plate construct a storage capacitor.

A material of the gate isolation layer and a material of the etching stopper layer are different.

Optionally, a material of the gate isolation layer is $Al_2O_3$, and a material of the etching stopper layer is SiOx.

Optionally, a material of the gate isolation layer is SiOx, and a material of the etching stopper layer is $Al_2O_3$.

The present invention further provides a manufacturing method of a thin film transistor array substrate, comprising the following steps:

Step 1, providing a substrate and depositing a first metal layer on the substrate, and implementing a patterning process to the first metal layer to obtain a first gate, a second gate, and a first electrode plate located on one side of the second gate that is distant from the first gate;

Step 2, depositing and patterning a gate isolation layer on the first metal layer to obtain a first via hole positioned above the second gate close to one side of the first gate;

Step 3, depositing and patterning an oxide semiconductor layer on the gate isolation layer to obtain a first oxide semiconductor layer above the first gate and a second oxide semiconductor layer above the second gate;

Step 4, depositing an etching stopper layer on the oxide semiconductor layer, and implementing a patterning process to the etching stopper layer to expose two side areas of the first oxide semiconductor layer and the second oxide semiconductor layer, and partially etching the etching stopper layer above the first electrode plate;

Step 5, depositing a second metal layer on the etching stopper layer and the gate isolation layer, and implementing a patterning process to the second metal layer to obtain a first source and a first drain above the first gate, a second source and a second drain above the second gate, and a second electrode plate above the first electrode plate;

wherein the first source and the first drain contact with the two side areas of the first oxide semiconductor layer; the second source and the second drain contact with the two side areas of the second oxide semiconductor layer; and the first source contacts with the second gate through the first via hole;

Step 6, sequentially forming a passivation layer, a flat layer, a pixel electrode layer, a pixel definition layer and a photospacer on the second metal layer and the etching stopper layer;

wherein the passivation layer and the flat layer are formed with a second via hole correspondingly above the second source and the pixel definition layer is formed with a third via hole correspondingly above the pixel electrode layer; and the pixel electrode layer contacts with the second source through the second via hole and the third via hole exposes a portion of the pixel electrode layer.

The gate isolation layer and the etching stopper layer are formed of different materials.

Optionally, the gate isolation layer is formed of $Al_2O_3$ and the etching stopper layer is formed of SiOx.

Optionally, the gate isolation layer is formed of SiOx and the etching stopper layer is formed of $Al_2O_3$.

The present invention further provides a manufacturing method of a thin film transistor array substrate, comprising the following steps:

Step 1, providing a substrate and depositing a first metal layer on the substrate, and implementing a patterning process to the first metal layer to obtain a first gate, a second gate, and a first electrode plate located on one side of the second gate that is distant from the first gate;

Step 2, depositing and patterning a gate isolation layer on the first metal layer to obtain a first via hole positioned above the second gate close to one side of the first gate;

Step 3, depositing and patterning an oxide semiconductor layer on the gate isolation layer to obtain a first oxide semiconductor layer above the first gate and a second oxide semiconductor layer above the second gate;

Step 4, depositing an etching stopper layer on the oxide semiconductor layer, and implementing a patterning process to the etching stopper layer to expose two side areas of the first oxide semiconductor layer and the second oxide semiconductor layer, and partially etching the etching stopper layer above the first electrode plate;

Step 5, depositing a second metal layer on the etching stopper layer and the gate isolation layer, and implementing a patterning process to the second metal layer to obtain a first source and a first drain above the first gate, a second source and a second drain above the second gate, and a second electrode plate above the first electrode plate;

wherein the first source and the first drain contact with the two side areas of the first oxide semiconductor layer; the second source and the second drain contact with the two side areas of the second oxide semiconductor layer; and the first source contacts with the second gate through the first via hole;

Step 6, sequentially forming a passivation layer, a flat layer, a pixel electrode layer, a pixel definition layer and a photospacer on the second metal layer and the etching stopper layer;

wherein the passivation layer and the flat layer are formed with a second via hole correspondingly above the second source and the pixel definition layer is formed with a third via hole correspondingly above the pixel electrode layer; and the pixel electrode layer contacts with the second source through the second via hole and the third via hole exposes a portion of the pixel electrode layer;

wherein the gate isolation layer and the etching stopper layer are formed of different materials; and wherein the gate isolation layer is formed of $Al_2O_3$ and the etching stopper layer is formed of SiOx.

The benefits of the present invention are as follows. Regarding the thin film transistor array substrate provided by the present invention, because there is only one isolation layer, which is the gate isolation layer or the etching stopper layer, existing between the two electrode plates of the storage capacitor in the aforesaid thin film transistor array substrate, the isolation layer thickness of the storage capacitor is thinner, and relatively, the capacitor occupies a smaller area and possesses a higher aperture ratio. In the manufacturing method of the thin film transistor array substrate according to the present invention, as etching the etching stopper layer, the portion of the etching stopper layer on the first electrode plate is etched, and thus, the isolation layer thickness of the storage capacitor can be decreased, and relatively, the capacitor occupies a smaller area and possesses a higher aperture ratio; meanwhile, because the gate isolation layer and the etching stopper layer are formed of different materials, and the etching gas is passive to the gate isolation layer for preventing the damage to the gate isolation layer under in the process of etching the etching stopper layer, it can be ensured to obtain an ideal storage capacitor.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In the drawings.

DETAILED DESCRIPTION OF THE PREFERRED EMBODIMENTS

For better explaining the technical solution and the effect of the present invention, the present invention will be further described in detail with the accompanying drawings and the specific embodiments.

Figure 1:
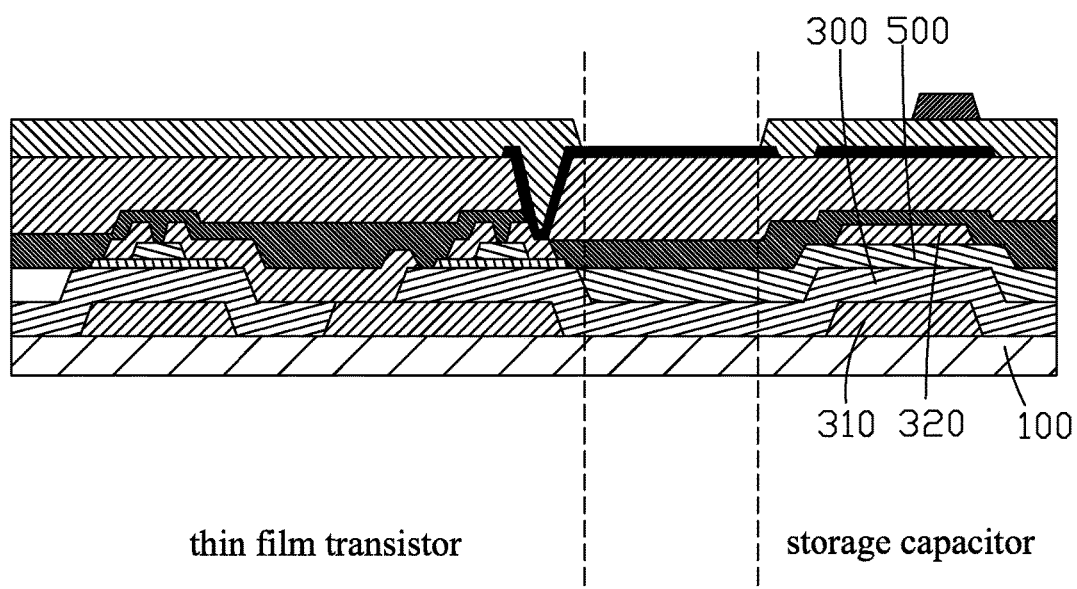
FIG. 1 is a sectional view showing a known thin film transistor array substrate.
Figure 2:
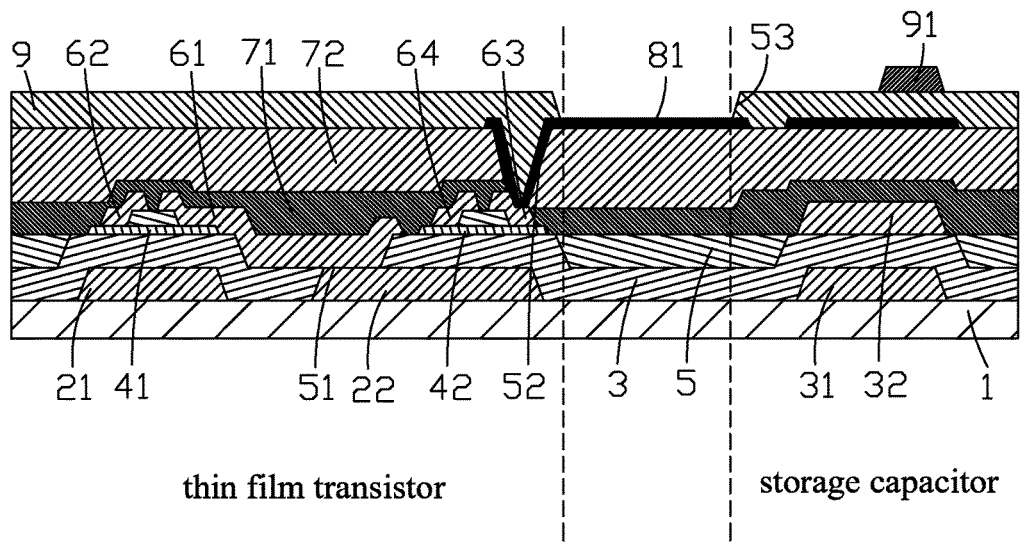
FIG. 2 is a sectional view showing a first embodiment of a thin film transistor array substrate according to the present invention.
Figure 3:
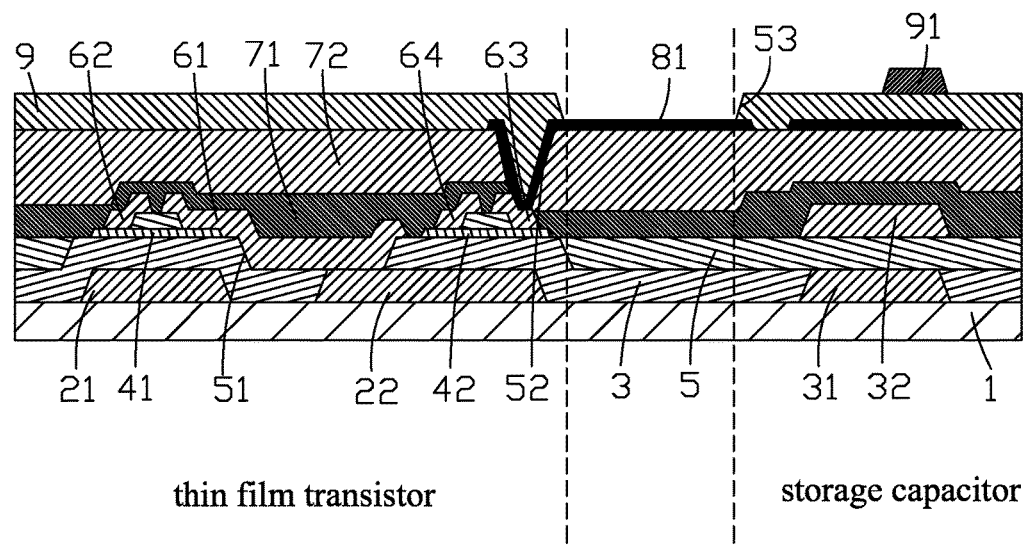
FIG. 3 is a sectional view showing a second embodiment of a thin film transistor array substrate according to the present invention.

Referring to FIGS. 2 and 3, the present invention provides a thin film transistor array substrate, which comprises a substrate 1 and a thin film transistor and a storage capacitor formed on the substrate 1.

The storage capacitor comprises a first electrode plate 31 on the substrate 1, a gate isolation layer 3 or an etching stopper layer 5 on the first electrode plate 31, a second electrode plate 32 on the gate isolation layer 3 or the etching stopper layer 5.

As shown in FIG. 2, a first embodiment of the thin film transistor array substrate according to the present invention is shown, comprising a substrate 1, a first gate 21, a second gate 22 and a first electrode plate 31 at one side of the second gate 22 away from the first gate 21 positioned on the substrate 1, a gate isolation layer 3 positioned on the first gate 21, the second gate 22, the first electrode plate 31 and the substrate 1, a first oxide semiconductor layer 41 and a second oxide semiconductor layer 42 respectively above the first gate 21 and the second gate 22 positioned on the gate isolation layer 3, a second electrode plate 32 above the first electrode plate 31 positioned on the gate isolation layer 3, an etching stopper layer 5 positioned on the first oxide semiconductor layer 41, the second oxide semiconductor layer 42 and the gate isolation layer 3, a first source 61, a first drain 62, a second source 63, a second drain 64 respectively above the first gate 21 and the second gate 22 positioned on the etching stopper layer 5, a passivation layer 71 positioned above the first source 61, the first drain 62, the second source 63, the second drain 64 and the second electrode plate 32 covering the etching stopper layer 5, a flat layer 72 positioned on the passivation layer 71, a pixel electrode layer 81 positioned on the flat layer 72, a pixel definition layer 9 positioned on the flat layer 72 and the pixel electrode layer 81 and a photospacer 91 positioned on the pixel definition layer 9.

The gate isolation layer 3 is provided with a first via hole 51 correspondingly above the second gate 22 close to one side of the first gate 21, and the passivation layer 71 and the flat layer 72 are provided with a second via hole 52 correspondingly above the second source 63, and the pixel definition layer 9 is provided with a third via hole 53 correspondingly above the pixel electrode layer 81; the first source 61, the first drain 62 contact with the first oxide semiconductor layer 41, and the second source 63 and the second drain 64 contact with the second oxide semiconductor layer 42, and the first source 61 contacts with the second gate 22 through the first via hole 51, and the pixel electrode layer 81 contacts with the second source 63 through the second via hole 52, and the third via hole 53 exposes a portion of the pixel electrode layer 81.

The first gate 21, the second gate 22, the gate isolation layer 3, the first oxide semiconductor layer 41, the second oxide semiconductor layer 42, the etching stopper layer 5, the first source 61, the first drain 62, the second source 63 and the second drain 64 construct a thin film transistor; the first electrode plate 31, the second electrode plate 32 and the gate isolation layer 3 between the first electrode plate 31 and the second electrode plate 32 construct a storage capacitor.

Because there is only one isolation layer, namely the gate isolation layer 3, existing between the two electrode plates of the storage capacitor, the isolation layer thickness of the storage capacitor is thinner, and thus, the capacitor occupies a smaller area and possesses a higher aperture ratio.

Specifically, the gate isolation layer 3 and the etching stopper layer 5 are formed of different materials. For example, the gate isolation layer 3 is formed of $Al_2O_3$ and the etching stopper layer 5 is formed of SiOx; or alternatively, the gate isolation layer 3 is formed of SiOx and the etching stopper layer 5 is formed of $Al_2O_3$. In a manufacturing process, a portion of the etching stopper layer 5 on the first electrode plate 31 is etched off. Because the gate isolation layer 3 and the etching stopper layer 5 are formed of different materials, an etching gas for etching the etching stopper layer 5 is passive to the gate isolation layer 3, and the gate isolation layer 3 located thereunder will not be damaged in the etching process of the etching stopper layer 5 so as to preserve good element property.

As shown in FIG. 3, a second embodiment of the thin film transistor array substrate according to the present invention is shown, comprising a substrate 1, a first gate 21, a second gate 22 and a first electrode plate 31 at one side of the second gate 22 away from the first gate 21 positioned on the substrate 1, a gate isolation layer 3 positioned on the first gate 21, the second gate 22 and the substrate 1, a first oxide semiconductor layer 41 and a second oxide semiconductor layer 42 respectively above the first gate 21 and the second gate 22 positioned on the gate isolation layer 3, an etching stopper layer 5 positioned on the first oxide semiconductor layer 41, the second oxide semiconductor layer 42, the gate isolation layer 3 and the first electrode plate 31, a second electrode plate 32 above the first electrode plate 31 positioned on the etching stopper layer 5, a first source 61, a first drain 62, a second source 63, a second drain 64 respectively above the first gate 21 and the second gate 22 positioned on the etching stopper layer 5, a passivation layer 71 positioned above the first source 61, the first drain 62, the second source 63, the second drain 64 and the second electrode plate 32 covering the etching stopper layer 5, a flat layer 72 positioned on the passivation layer 71, a pixel electrode layer 81 positioned on the flat layer 72, a pixel definition layer 9 positioned on the flat layer 72 and the pixel electrode layer 81 and a photospacer 91 positioned on the pixel definition layer 9.

The gate isolation layer 3 is provided with a first via hole 51 correspondingly above the second gate 22 close to one side of the first gate 21; the passivation layer 71 and the flat layer 72 are provided with a second via hole 52 correspondingly above the second source 63; and the pixel definition layer 9 is provided with a third via hole 53 correspondingly above the pixel electrode layer 81. The first source 61 and the first drain 62 contact with the first oxide semiconductor layer 41; the second source 63 and the second drain 64 contact with the second oxide semiconductor layer 42; and the first source 61 contacts with the second gate 22 through the first via hole 51, and the pixel electrode layer 81 contacts with the second source 63 through the second via hole 52, and the third via hole 53 exposes a portion of the pixel electrode layer 81.

The first gate 21, the second gate 22, the gate isolation layer 3, the first oxide semiconductor layer 41, the second oxide semiconductor layer 42, the etching stopper layer 5, the first source 61, the first drain 62, the second source 63 and the second drain 64 construct a thin film transistor; the first electrode plate 31, the second electrode plate 32 and the etching stopper layer 5 between the first electrode plate 31 and the second electrode plate 32 construct a storage capacitor.

Because there is only one isolation layer, namely the etching stopper layer 5, existing between the two electrode plates of the storage capacitor, and in a manufacturing process, a portion of the gate isolation layer 3 on the first electrode plate 31 is etched off, the isolation layer thickness of the storage capacitor is thinner, and thus, the capacitor occupies a smaller area and possesses a higher aperture ratio.

Preferably, there is only one isolation layer, which is the gate isolation layer 3, existing between the two electrode plates of the storage capacitor, and this is the aforesaid first embodiment. Because in the second embodiment, if the portion of the gate isolation layer 3 on the first electrode plate 31 is etched off, and no protection is applied to the first electrode plate 31 of the storage capacitor in the following process, which makes it easily be damaged, such as corrosion.

Because there is only one isolation layer, which is the gate isolation layer or the etching stopper layer, existing between the two electrode plates of the storage capacitor in the aforesaid thin film transistor array substrate, the isolation layer thickness of the storage capacitor is thinner, and thus, the capacitor occupies a smaller area and possesses a higher aperture ratio.

Figure 4:
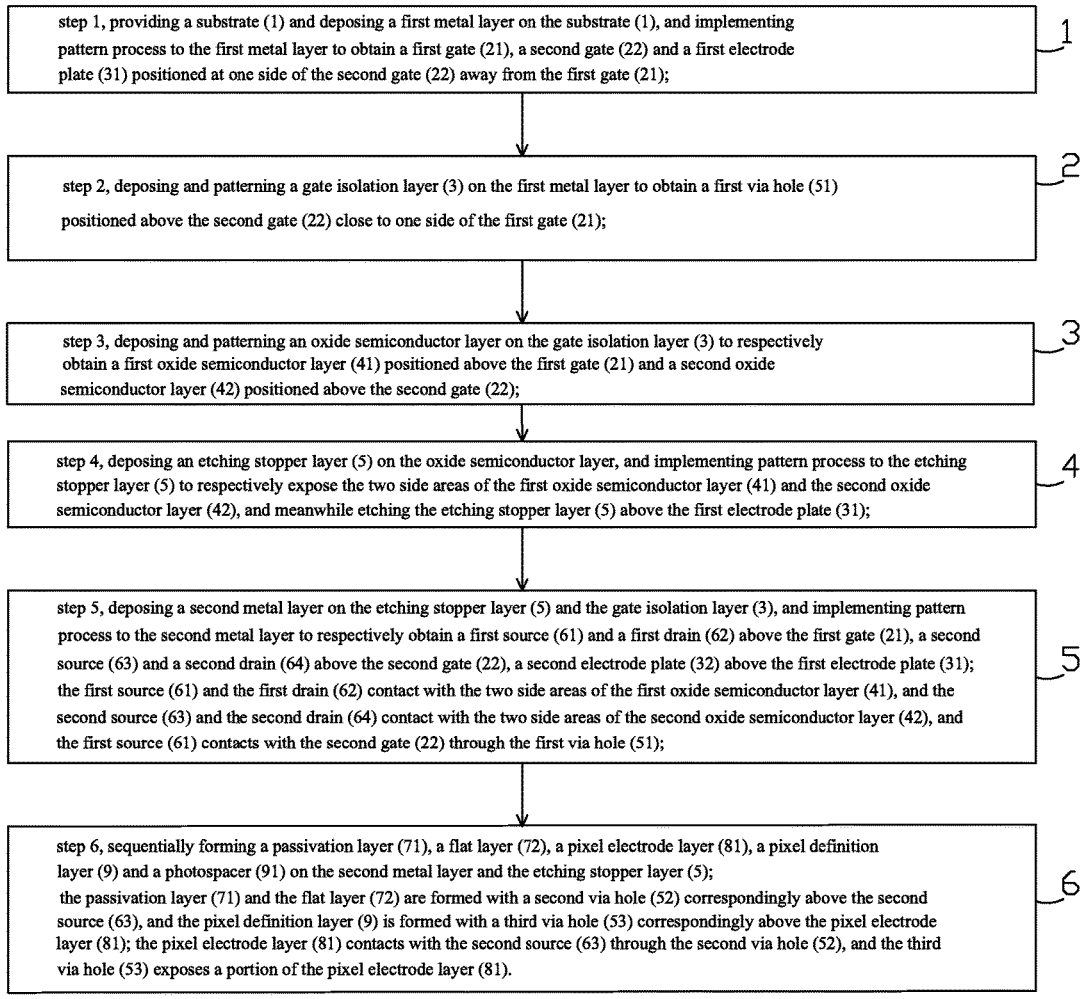
FIG. 4 is a flowchart illustrating a manufacturing method of a thin film transistor array substrate according to the present invention.

Referring to FIG. 4, in combination with FIG. 2, the present invention also provides a manufacturing method of a thin film transistor array substrate, which comprises the following steps:

Step 1, providing a substrate 1 and depositing a first metal layer on the substrate 1, and implementing a patterning process to the first metal layer to obtain a first gate 21, a second gate 22, and a first electrode plate 31 located on one side of the second gate 22 that is distant from the first gate 21.

Specifically, the substrate 1 is a glass substrate or a plastic substrate.

Step 2, depositing and patterning a gate isolation layer 3 on the first metal layer to obtain a first via hole 51 positioned above the second gate 22 close to one side of the first gate 21.

Step 3, depositing and patterning an oxide semiconductor layer on the gate isolation layer 3 to obtain a first oxide semiconductor layer 41 above the first gate 21 and a second oxide semiconductor layer 42 above the second gate 22.

Step 4, depositing an etching stopper layer 5 on the oxide semiconductor layer, and implementing a patterning process to the etching stopper layer 5 to expose two side areas of the first oxide semiconductor layer 41 and the second oxide semiconductor layer 42, and partially etching the etching stopper layer 5 above the first electrode plate 31.

Specifically, the gate isolation layer 3 and the etching stopper layer 5 are formed of different materials. For example, the gate isolation layer 3 is formed of $Al_2O_3$ and the etching stopper layer 5 is formed of SiOx; or, alternatively, the gate isolation layer 3 is formed of SiOx and the etching stopper layer 5 is formed of $Al_2O_3$. An etching gas for etching the etching stopper layer 5 is passive to the gate isolation layer 3. Thus, the gate isolation layer 3 located thereunder will not be damaged in an etching process of the etching stopper layer 5 and good element property can be preserved.

Step 5, depositing a second metal layer on the etching stopper layer 5 and the gate isolation layer 3, and implementing a patterning process to the second metal layer to obtain a first source 61 and a first drain 62 above the first gate 21, a second source 63 and a second drain 64 above the second gate 22, and a second electrode plate 32 above the first electrode plate 31.

The first source 61 and the first drain 62 contact with two side areas of the first oxide semiconductor layer 41. The second source 63 and the second drain 64 contact with two side areas of the second oxide semiconductor layer 42. The first source 61 contacts with the second gate 22 through the first via hole 51.

Step 6, sequentially forming a passivation layer 71, a flat layer 72, a pixel electrode layer 81, a pixel definition layer 9 and a photospacer 91 on the second metal layer and the etching stopper layer 5.

The passivation layer 71 and the flat layer 72 are formed with a second via hole 52 correspondingly above the second source 63. The pixel definition layer 9 is formed with a third via hole 53 correspondingly above the pixel electrode layer 81. The pixel electrode layer 81 contacts with the second source 63 through the second via hole 52. The third via hole 53 exposes a portion of the pixel electrode layer 81.

Specifically, all the passivation layer 71, the flat layer 72, the pixel electrode layer 81, the pixel definition layer 9 and the photospacer 91 can be manufactured with the present skills.

Significantly, in manufacturing the aforesaid thin film transistor array substrate, it can be another option to selectively etching the portion of the gate isolation layer 3 on the first electrode plate 31 to make only one isolation layer, namely the etching stopper layer 5, existing between the two electrode plates of the storage capacitor, to decrease the isolation layer thickness of the storage capacitor, and relatively, the capacitor occupies a smaller area and possesses a higher aperture ratio; however, the drawback of this manufacture method is that, no protection is applied to the first electrode plate 31 of the storage capacitor in the following process, which makes it easily be damaged, such as corrosion.

In the aforesaid manufacturing method of the thin film transistor array substrate, as etching the etching stopper layer, the portion of the etching stopper layer on the first electrode plate is etched, and thus, the isolation layer thickness of the storage capacitor can be decreased, and thus, the capacitor occupies a smaller area and possesses a higher aperture ratio; meanwhile, because the gate isolation layer and the etching stopper layer are formed of different materials, and the etching gas is passive to the gate isolation layer for preventing the damage to the gate isolation layer under in the process of etching the etching stopper layer, it can be ensured to obtain an ideal storage capacitor.

In conclusion, as regarding the thin film transistor array substrate provided by the present invention, because there is only one isolation layer, which is the gate isolation layer or the etching stopper layer, existing between the two electrode plates of the storage capacitor in the aforesaid thin film transistor array substrate, the isolation layer thickness of the storage capacitor is thinner, and relatively, the capacitor occupies a smaller area and possesses a higher aperture ratio. In the manufacture method of the thin film transistor array substrate according to the present invention, as etching the etching stopper layer, the portion of the etching stopper layer on the first electrode plate is etched, and thus, the isolation layer thickness of the storage capacitor can be decreased, and relatively, the capacitor occupies a smaller area and possesses a higher aperture ratio; meanwhile, because the gate isolation layer and the etching stopper layer are formed by different materials, and the etching gas is passive to the gate isolation layer for preventing the damage to the gate isolation layer under in the process of etching the etching stopper layer, it can be ensured to obtain an ideal storage capacitor.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacturing method of a thin film transistor array substrate, comprising the followings steps:
    Step 1, providing a substrate and depositing a first metal layer on the substrate, and implementing a patterning process to the first metal layer to obtain a first gate, a second gate, and a first electrode plate located on one side of the second gate that is distant from the first gate;
    Step 2, depositing and patterning a gate isolation layer on the first metal layer to obtain a first via hole positioned above the second gate close to one side of the first gate;
    Step 3, depositing and patterning an oxide semiconductor layer on the gate isolation layer to obtain a first oxide semiconductor layer above the first gate and a second oxide semiconductor layer above the second gate;
    Step 4, depositing an etching stopper layer on the oxide semiconductor layer, and implementing a patterning process to the etching stopper layer to expose two side areas of the first oxide semiconductor layer and the second oxide semiconductor layer, and etching and removing a portion of the etching stopper layer located above the first electrode plate;
    Step 5, depositing a second metal layer on the etching stopper layer and the gate isolation layer, and implementing a patterning process to the second metal layer to obtain a first source and a first drain above the first gate, a second source and a second drain above the second gate, and a second electrode plate above the first electrode plate,
    wherein the first source and the first drain contact with two side areas of the first oxide semiconductor layer; the second source and the second drain contact with two side areas of the second oxide semiconductor layer; and the first source contacts with the second gate through the first via hole; and
    Step 6, sequentially forming a passivation layer, a flat layer, a pixel electrode layer, a pixel definition layer and a photospacer on the second metal layer and the etching stopper layer,
    wherein the passivation layer and the flat layer are formed with a second via hole correspondingly above the second source; the pixel definition layer is formed with a third via hole correspondingly above the pixel electrode layer; the pixel electrode layer contacts with the second source through the second via hole; and the third via hole exposes a portion of the pixel electrode layer.

2. The manufacturing method of the thin film transistor array substrate as claimed in claim 1, wherein the gate isolation layer and the etching stopper layer are formed of different materials.

3. The manufacturing method of the thin film transistor array substrate as claimed in claim 1, wherein the gate isolation layer is formed of $Al_2O_3$ and the etching stopper layer is formed of SiOx.

4. The manufacturing method of the thin film transistor array substrate as claimed in claim 1, wherein the gate isolation layer is formed of SiOx and the etching stopper layer is formed of $Al_2O_3$.

5. A manufacturing method of a thin film transistor array substrate, comprising the followings steps:

Step 1, providing a substrate and depositing a first metal layer on the substrate, and implementing a patterning process to the first metal layer to obtain a first gate, a second gate, and a first electrode plate located on one side of the second gate that is distant from the first gate;

Step 2, depositing and patterning a gate isolation layer on the first metal layer to obtain a first via hole positioned above the second gate close to one side of the first gate;

Step 3, depositing and patterning an oxide semiconductor layer on the gate isolation layer to obtain a first oxide semiconductor layer above the first gate and a second oxide semiconductor layer above the second gate;

Step 4, depositing an etching stopper layer on the oxide semiconductor layer, and implementing a patterning process to the etching stopper layer to expose two side areas of the first oxide semiconductor layer and the second oxide semiconductor layer, and etching and removing a portion of the etching stopper layer located above the first electrode plate;

Step 5, depositing a second metal layer on the etching stopper layer and the gate isolation layer, and implementing a patterning process to the second metal layer to obtain a first source and a first drain above the first gate, a second source and a second drain above the second gate, and a second electrode plate above the first electrode plate, wherein the first source and the first drain contact with two side areas of the first oxide semiconductor layer; the second source and the second drain contact with two side areas of the second oxide semiconductor layer; and the first source contacts with the second gate through the first via hole; and Step 6, sequentially forming a passivation layer, a flat layer, a pixel electrode layer, a pixel definition layer and a photospacer on the second metal layer and the etching stopper layer, wherein the passivation layer and the flat layer are formed with a second via hole correspondingly above the second source; the pixel definition layer is formed with a third via hole correspondingly above the pixel electrode layer; the pixel electrode layer contacts with the second source through the second via hole; and the third via hole exposes a portion of the pixel electrode layer;

wherein the gate isolation layer and the etching stopper layer are formed of different materials; and wherein the gate isolation layer is formed of $Al_2O_3$ and the etching stopper layer is formed of SiOx.

\* \* \* \* \*